(12) United States Patent
Chung (10) Patent No.: US 8,130,183 B2
(45) Date of Patent: Mar. 6, 2012

(54) SCAN DRIVER AND SCAN SIGNAL DRIVING METHOD AND ORGANIC LIGHT EMITTING DISPLAY USING THE SAME

(75) Inventor: Bo-yong Chung, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 861 days.

(21) Appl. No.: 11/882,186

(22) Filed: Jul. 31, 2007

(65) Prior Publication Data

US 2008/0074359 A1 Mar. 27, 2008

(30) Foreign Application Priority Data

Sep. 22, 2006 (KR) .................... 10-2006-0092493

(51) Int. Cl.
*G09G 3/30* (2006.01)
(52) U.S. Cl. .................................. 345/82; 345/76
(58) Field of Classification Search .............. 345/76, 345/99, 100, 82, 83
See application file for complete search history.

(56) References Cited

U.S. PATENT DOCUMENTS

| 4,084,106 | A | 4/1978 | Ullrich | |
|---|---|---|---|---|
| 6,928,136 | B2 | 8/2005 | Nagao et al. | |
| 2002/0186196 | A1* | 12/2002 | Park | 345/100 |
| 2003/0128180 | A1 | 7/2003 | Kim et al. | |
| 2003/0178947 | A1 | 9/2003 | Shin et al. | |
| 2005/0184763 | A1 | 8/2005 | Kondo | |
| 2005/0220263 | A1* | 10/2005 | Moon | 377/68 |
| 2006/0152459 | A1 | 7/2006 | Shin | |
| 2006/0156118 | A1 | 7/2006 | Shin | |
| 2007/0063933 | A1* | 3/2007 | Chung | 345/76 |

FOREIGN PATENT DOCUMENTS

| EP | 1763003 A2 | 3/2007 |
|---|---|---|
| EP | 1843317 A1 | 10/2007 |
| JP | 58-182196 A | 10/1983 |
| JP | 52-075943 | 6/1997 |
| JP | 2003-101394 A | 4/2003 |
| KR | 10-2006-0059082 A | 6/2006 |
| KR | 10-2006-0080636 | 7/2006 |

OTHER PUBLICATIONS

European Extended Search Report in EP 072537050.9-1228/1903552, dated Apr. 23, 2009 (Chung).

* cited by examiner

*Primary Examiner* — Chanh Nguyen
*Assistant Examiner* — Allison Walthall
(74) *Attorney, Agent, or Firm* — Lee & Morse, P.C.

(57) ABSTRACT

A scan driver includes a plurality of stages coupled to each other in series, each of the stages configured to receive a clock signal, a clock bar signal, and an input signal, wherein each stage includes a first circuit that is configured to store a first voltage and a second voltage in response to the input signal and one of the clock signal or the clock bar signal, the first voltage and the second voltage each corresponding to a voltage of the input signal, and provide a first output signal that corresponds to the second voltage in response to the second voltage and the other of the clock signal or the clock bar signal.

15 Claims, 6 Drawing Sheets

SCAN DRIVER AND SCAN SIGNAL DRIVING METHOD AND ORGANIC LIGHT EMITTING DISPLAY USING THE SAME

BACKGROUND OF THE INVENTION

1. Field of the Invention

The present invention relates to a scan driver, a scan signal driving method, and an organic light emitting display using the same. More particularly, the present invention relates to a scan driver that may be implemented using PMOS or NMOS transistors, and a scan signal driving method and an organic light emitting display using the same.

2. Description of the Related Art

Flat panel displays may include a display area that has a plurality of pixels arranged on a substrate in a matrix, and may display an image by selectively applying data signals to the pixels which are coupled to corresponding scan lines and data lines.

A flat panel display may be classified as a passive-matrix display or an active-matrix display according to how the pixels are driven. In terms of resolution, contrast, and operating speed, the active-matrix display, in which each pixel is selectively switched either on or off, has become mainstream.

A flat panel display may be used as display apparatus for portable information terminals such as a personal computer, a mobile station, a PDA, etc., and monitors for various kinds of information equipment. As flat panel displays, an LCD using a liquid crystal panel, an organic flat display using an OLED (Organic Light Emitting Diode), a PDP using a plasma panel, etc., are well known.

Recently, various flat panel displays capable of reducing weight and volume, which are disadvantages of cathode ray tubes (CRTs), have been developed. Since the organic light emitting display may exhibit excellent light emitting efficiency, brightness, and viewing angle, has a short response time, and can be made light-weight and thin, it has come into the spotlight.

In order to reduce manufacturing costs, it may be desirable to form an organic light emitting display having both a pixel portion and a scan driver formed on a substrate. However, the pixel of the organic light emitting display is formed of only PMOS transistors or NMOS transistors, whereas typical scan drivers are CMOS, including both PMOS transistors and NMOS transistors. Accordingly, the typical scan driver is formed as an external driver and may require additional processes, thereby causing a size and a weight of the organic light emitting display to be increased, increasing process complexity, and increasing costs.

SUMMARY OF THE INVENTION

The present invention is therefore directed to a scan driver, a scan signal driving method and an organic light emitting display using the same, which substantially overcome one or more of the problems due to the limitations and disadvantages of the related art.

It is therefore a feature of an embodiment of the present invention to provide a scan driver configured using one of PMOS and NMOS transistors, a method of driving the same, and an organic light emitting display using the same.

It is therefore another feature of an embodiment of the present invention to provide a scan driver configured using a same transistor as used in a pixel driving circuit, a method of driving the same, and an organic light emitting display using the scan driver and the pixel driving circuit.

At least one of the above and other features and advantages of the present invention may be realized by providing a scan driver, including a plurality of stages coupled to each other in series, each of the stages configured to receive a clock signal, a clock bar signal, and an input signal, wherein each stage includes a first circuit that is configured to store a first voltage and a second voltage in response to the input signal and one of the clock signal or the clock bar signal, the first voltage and the second voltage each corresponding to a voltage of the input signal, and provide a first output signal that corresponds to the second voltage in response to the second voltage and the other of the clock signal or the clock bar signal.

The input signal may be a start pulse when the stage is a first stage, and the input signal may be an output signal of a previous stage when the stage is not the first stage.

The first circuit in a first stage may include a first transistor configured to transfer a drive power to a first node in response to the clock signal, a second transistor configured to control a voltage of the first node in response to a voltage of a second node, a third transistor configured to transfer a voltage of the input signal to the second node in response to the clock signal, and a first capacitor coupled to the first node and the second node and configured to store a voltage corresponding to the drive power and the input signal voltage, wherein a voltage of the first output signal may correspond to the voltage of the first node.

The first circuit in a second stage directly succeeding the first stage may include an eleventh transistor configured to transfer a drive power to a seventh node in response to the clock bar signal, a twelfth transistor configured to control a voltage of the seventh node in response to a voltage of an eighth node, a thirteenth transistor configured to transfer a voltage of a signal output by the first stage to the eighth node in response to the clock bar signal, and a fourth capacitor coupled to the seventh node and the eighth node and configured to store a voltage corresponding to the drive power and the voltage of the signal output by the first stage, wherein the first circuit in the second stage may be configured to output a signal having a voltage corresponding to the voltage of the seventh node.

Each stage may further include a second circuit configured to receive the first output signal from the first circuit and the one of the clock signal or the clock bar signal, and configured to provide a second output signal, and a third circuit configured to receive the first output signal and the second output signal, and configured to provide a scan signal.

The input signal may include a first pulse having a pulse width equal to one-half cycle of the clock signal, the scan signal may include a second pulse having a pulse width equal to that of the first pulse, the polarity of the first pulse may be the same as the polarity of the second pulse, and the second pulse may be offset from the first pulse by one half clock cycle.

The second circuit may include a fourth transistor configured to transfer a drive power to a third node in response to the first output signal, a fifth transistor configured to control the third and fourth nodes to have a same voltage in response to the first output signal, a sixth transistor configured to control a voltage of the third node in response to a voltage of the fourth node, a seventh transistor configured to control a voltage of the fourth node in response to the clock signal, and a second capacitor coupled to the third node and the fourth node, wherein a voltage of the second output signal may correspond to the voltage of the third node.

The third circuit may include an eighth transistor configured to transfer a drive power to a fifth node in response to the second output signal, a ninth transistor configured to control the fifth node and a sixth node to having a same voltage in response to the second output signal, a tenth transistor configured to control the voltage of the fifth node in response to a voltage of the sixth node, an eleventh transistor configured to control the voltage of the sixth node in response to the first output signal, and a third capacitor coupled to the fifth node and the sixth node, wherein a voltage of the scan signal may correspond to the voltage of the fifth node.

The first, second and third circuits may be formed using one of PMOS transistors and NMOS transistors.

At least one of the above and other features and advantages of the present invention may also be realized by providing an organic light emitting display, including a pixel portion having at least one pixel coupled to a data line and a scan line, a data driver configured to provide a data signal to the data line, and a scan driver configured to provide a scan signal to the scan line, wherein the scan driver may include a plurality of stages coupled to each other in series, each of the stages configured to receive a clock signal, a clock bar signal, and an input signal, wherein each stage may include a first circuit that is configured to store a first voltage and a second voltage in response to the input signal and one of the clock signal or the clock bar signal, the first voltage and the second voltage each corresponding to a voltage of the input signal, and provide a first output signal that corresponds to the second voltage in response to the second voltage and the other of the clock signal or the clock bar signal.

The input signal may be a start pulse when the stage is a first stage, and the input signal may be an output signal of a previous stage when the stage is not the first stage. The first circuit in a first stage may include a first transistor configured to transfer a drive power to a first node in response to the clock signal, a second transistor configured to control a voltage of the first node in response to a voltage of a second node, a third transistor configured to transfer a voltage of the input signal to the second node in response to the clock signal, and a first capacitor coupled to the first node and the second node and configured to store a voltage corresponding to the drive power and the input signal voltage, wherein a voltage of the first output signal may correspond to the voltage of the first node.

Each stage may further include a second circuit configured to receive the first output signal from the first circuit and the one of the clock signal or the clock bar signal, and configured to provide a second output signal, and a third circuit configured to receive the output signal and the second output signal, and configured to provide a scan signal.

The input signal may include a first pulse having a pulse width equal to one-half cycle of the clock signal, the scan signal may include a second pulse having a pulse width equal to that of the first pulse, the polarity of the first pulse may be the same as the polarity of the second pulse, and the second pulse may be offset from the first pulse by one half clock cycle.

The second circuit may include a fourth transistor configured to transfer a drive power to a third node in response to the first output signal, a fifth transistor configured to control the third and fourth nodes to have a same voltage in response to the first output signal, a sixth transistor configured to control a voltage of the third node in response to a voltage of the fourth node, a seventh transistor configured to control a voltage of the fourth node in response to the clock signal, and a second capacitor coupled to the third node and the fourth node, wherein a voltage of the second output signal may correspond to the voltage of the third node.

The third circuit may include an eighth transistor configured to transfer a drive power to a fifth node in response to the second output signal, a ninth transistor configured to control the fifth node and a sixth node to having a same voltage in response to the second output signal, a tenth transistor configured to control the voltage of the fifth node in response to a voltage of the sixth node, an eleventh transistor configured to control the voltage of the sixth node in response to the first output signal, and a third capacitor coupled to the fifth node and the sixth node, wherein a voltage of the scan signal may correspond to the voltage of the fifth node.

The first, second and third circuits may be formed using one of PMOS transistors and NMOS transistors.

At least one of the above and other features and advantages of the present invention may further be realized by providing a method of sequentially driving a scan signal in a stage of a scan driver that includes a plurality of stages coupled to each other in series, each of the stages configured to receive a clock signal, a clock bar signal, and an input signal, the method including storing a first voltage and a second voltage in the stage in response to the input signal and one of the clock signal or the clock bar signal, the first voltage and the second voltage each corresponding to a voltage of the input signal, and providing a first output signal that corresponds to the second voltage in response to the second voltage and the other of the clock signal or the clock bar signal.

The input signal may be a start pulse when the stage is a first stage, and the input signal may be an output signal of a previous stage when the stage is not the first stage.

The method may further include receiving the first output signal and the one of the clock signal or the clock bar signal, and providing a second output signal in response thereto, and receiving the first output signal and the second output signal, and providing a scan signal in response thereto.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0092493, filed on Sep. 22, 2006, in the Korean Intellectual Property Office, and entitled: "Scan Driver and Scan Signal Driving Method and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

Where an element is shown as being coupled to another element, the element may be directly coupled to the other element, or may be indirectly coupled to the other element via one or more additional elements. In the drawings, elements may be omitted for simplicity and clarity. Like reference numerals refer to like elements throughout.

Figure 1:
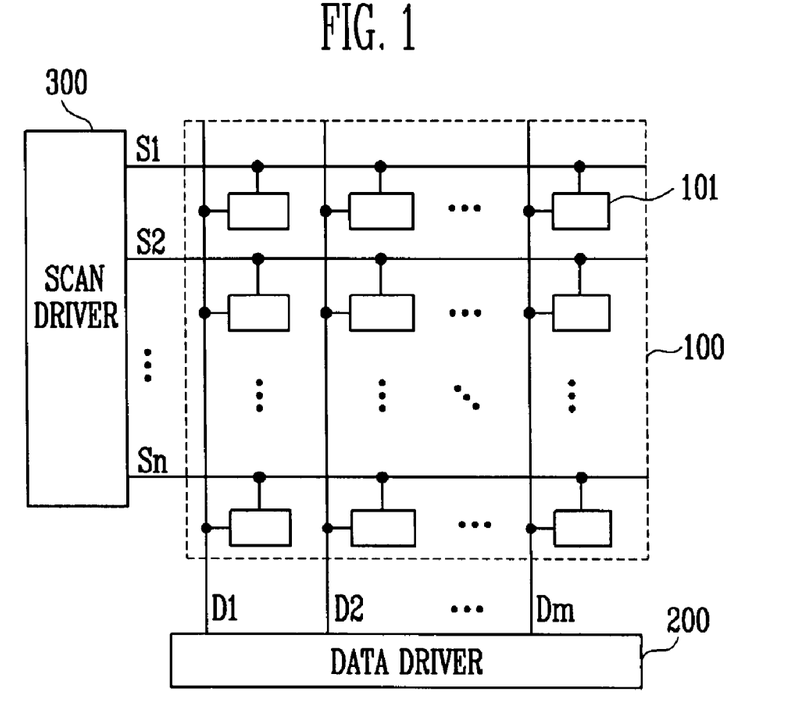
FIG. 1 illustrates a block diagram of an organic light emitting display according to an embodiment of the present invention.

FIG. 1 illustrates a block diagram of an organic light emitting display according to an embodiment of the present invention. Referring to FIG. 1, the organic light emitting display may include a pixel portion 100, a data driver 200, and a scan driver 300.

The pixel portion 100 may include a plurality of data lines D, e.g., data lines D1, D2, . . . , Dm−1, Dm. The pixel portion 100 may also include a plurality of scan lines S, e.g., scan lines S1, S2, . . . , Sn−1, Sn. The pixel portion 100 may further include a plurality of pixels 101, which may be formed in a region defined by the plurality of data lines D1, D2, . . . , Dm−1, Dm, and the plurality of scan lines S1, S2, . . . , Sn−1, Sn.

Figure 2:
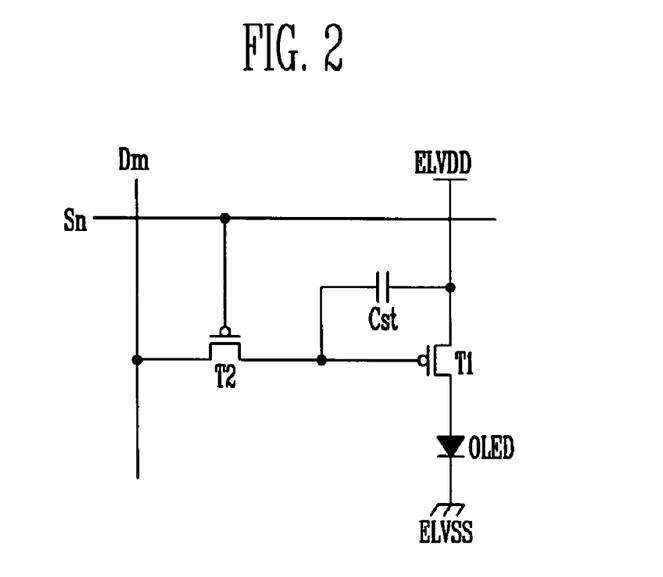
FIG. 2 illustrates a circuit diagram of a pixel of the organic light emitting display shown in FIG. 1.

FIG. 2 illustrates a circuit diagram of a pixel 101 of the organic light emitting display shown in FIG. 1. In an implementation, each of the pixels 101 may include a pixel circuit and an organic light emitting diode. The pixel 101 may generate a pixel current flowing through the pixel and may provide it to the organic light emitting diode according to a data signal transferred through the plurality of data lines D1, D2, . . . , Dm−1, Dm and the scan signal transferred through the plurality of scan lines S1, S2, . . . , Sn−1, Sn. As shown in FIG. 2, each pixel 101 may include a plurality of thin film transistors. In an implementation, the thin film transistors may all be PMOS transistors, or may all be NMOS transistors.

The data driver 200 may be coupled to the plurality of data lines D1, D2, . . . , Dm−1, Dm. The data driver 200 may generate data signals and may provide the data signals to the plurality of data lines D1, D2, . . . , Dm−1, Dm.

The scan driver 300 may be coupled to the plurality of scan lines S1, S2, . . . , Sn−1, Sn. The scan driver 300 may generate scan signals and may provide the scan signals to the plurality of scan lines S1, S2, . . . , Sn−1, Sn. A specific row may be selected by the scan signal, and a data signal may be provided to a pixel 101 positioned at the selected specific row, so that an electric current may be generated in the pixel 101 corresponding to the data signal.

In a scan driver according to an embodiment of the present invention, where the thin film transistors of the pixel portion 100 are PMOS transistors, the scan driver 300 may be formed of PMOS transistors, and where thin film transistors of the pixel portion 100 are NMOS transistors, the scan driver 300 may be formed of NMOS transistors. Thus, the scan driver 300 according to the present invention may be formed by the same process used to form the pixel portion 100, and the pixel portion 100 and the scan driver 300 may be formed on a same substrate.

Referring to FIG. 2, the pixel 101 may be coupled to a data line Dm, a scan line Sn, and a pixel power supply line ELVDD. The pixel 101 may include a first transistor T1, a second transistor T2, a capacitor Cst, and an OLED (organic light emitting diode).

Where the pixel portion 101 is formed using PMOS transistors, a source of the first transistor T1 may be coupled to the pixel power supply line ELVDD, a drain thereof may be coupled to the OLED, and a gate thereof may be coupled to a first node N1. A source of the second transistor T2 may be coupled to the data line Dm, a drain thereof may be coupled to the first node N1, and a gate thereof may be coupled to the scan line Sn. The capacitor Cst may be coupled between the first node N1 and the pixel power supply line ELVDD, and may maintain a voltage between the first node N1 and the pixel power supply line ELVDD. The OLED may include an anode electrode, a cathode electrode, and an emission layer. The anode electrode of the OLED may be coupled to the drain of the first transistor T1, a cathode electrode thereof may be coupled to a power supply ELVSS, which may be a lower voltage power supply. When an electric current flows from the anode electrode of the OLED to the cathode electrode thereof, the emission layer may emit light, with a luminance of the light corresponding to the amount of the electric current.

Figure 3:
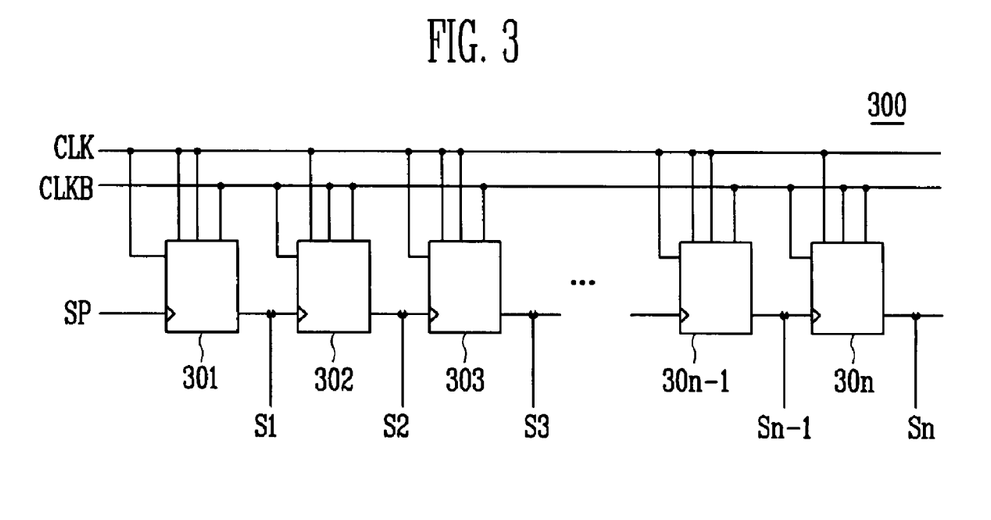
FIG. 3 illustrates a schematic diagram of a scan driver of the organic light emitting display shown in FIG. 1.

FIG. 3 illustrates a schematic diagram of a scan driver of the organic light emitting display shown in FIG. 1. Referring to FIG. 3, the scan driver 300 may include a plurality of stages 301, 302, . . . , 30n−1, 30n, which may be coupled to each other in series. Among the stages, the first stage 301 may receive a clock signal CLK, a clock bar signal CLKB, and a start pulse SP. Stages following the first stage 301, i.e., the stages 302, . . . , 30n−1, 30n, may receive the clock signal CLK, the clock bar signal CLKB, and scan signals S1, S2, . . . , Sn−2, Sn−1, which may be an output signal of a previous stage.

Figure 4:
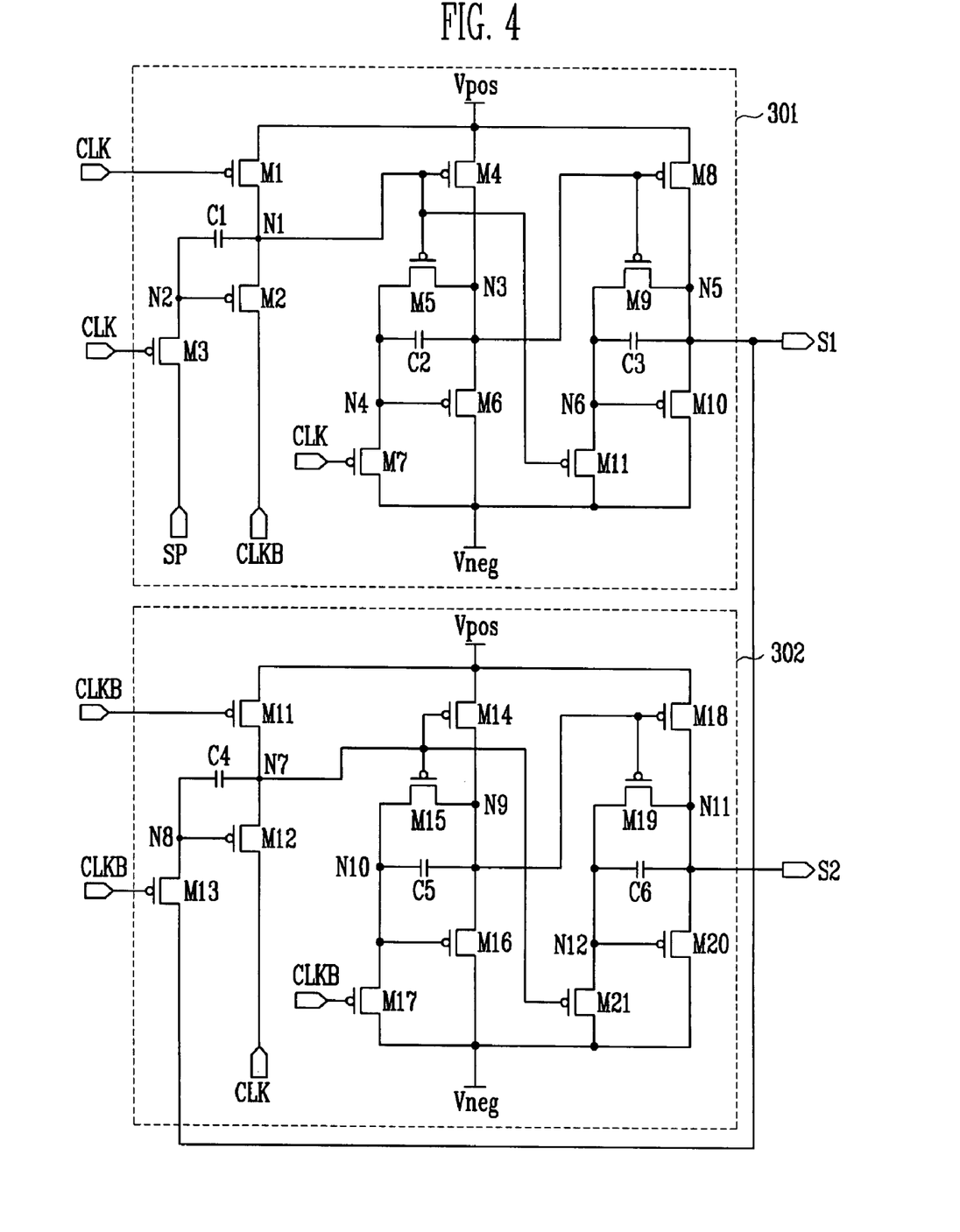
FIG. 4 illustrates a circuit diagram of two stages of the scan driver shown in FIG. 3.

FIG. 4 illustrates a circuit diagram of two stages 301 and 302 of the scan driver 300 shown in FIG. 3. Referring to FIG. 4, the first stage 301 may include a first circuit, a second circuit, and a third circuit. The second stage 302 may include a fourth circuit, a fifth circuit, and a sixth circuit.

In an implementation, the first though sixth circuits may be implemented using PMOS transistors. The first circuit may include a first transistor M1, a second transistor M2, a third transistor M3, and a first capacitor C1. A source of the first transistor M1 may be coupled to a first power supply Vpos, a gate thereof may be coupled to a clock terminal CLK, and a drain thereof may be coupled to a first node N1. A source of the second transistor M2 may be coupled to the first node N1, a gate thereof may be coupled to a second node N2, and a drain thereof may be coupled to a clock bar terminal CLKB. A source of the third transistor M3 may be coupled to the second node N2, a gate thereof may be coupled to the clock terminal CLK, and a drain thereof may be coupled to a start pulse input terminal SP. The first capacitor C1 may be coupled between the first node N1 and the second node N2.

The second circuit may include a fourth transistor M4, a fifth transistor M5, a sixth transistor M6, a seventh transistor M7, and a second capacitor C2. A source of the fourth transistor M4 may be coupled to a first power supply Vpos, a gate thereof may be coupled to the first node N1, and a drain thereof may be coupled to a third node N3. A source of the fifth transistor M5 may be coupled to a third node N3, a gate thereof may be coupled to the first node N1, and a drain thereof may be coupled to a fourth node N4. A source of the sixth transistor M6 may be coupled to the third node N3, a gate thereof may be coupled to the fourth node N4, and a drain thereof may be coupled a second power supply Vneg, which may have a voltage less than that of the first power supply Vpos. A source of the seventh transistor M7 may be coupled to the fourth node N4, a gate thereof may be coupled to a clock terminal CLK, and a drain thereof may be coupled to the first power supply Vneg. The second capacitor C2 may be coupled between the third node N3 and the fourth node N4.

The third circuit may include an eighth transistor M8, a ninth transistor M9, a tenth transistor M10, an eleventh transistor M11, and a third capacitor C3. A source of the eighth transistor M8 may be coupled to the first power supply Vpos, a gate thereof may be coupled to the third node N3, and a drain thereof may be coupled to a fifth node N5. A source of the ninth transistor M9 may be coupled to the fifth node N5, a gate thereof may be coupled to the third node N3, and a drain thereof may be coupled to a sixth node N6. A source of the tenth transistor M10 may be coupled to the fifth node N5, a gate thereof may be coupled to the sixth node N6, and a drain thereof may be coupled to the second power supply Vneg. A source of the eleventh transistor M11 may be coupled to the sixth node N6, a gate thereof may be coupled to the first node N1, and a drain thereof may be coupled to the second power supply Vneg. The third capacitor C3 may be coupled between the fifth node N5 and the sixth node N6. Further, the fifth node N5 may be used as an output terminal.

The fourth circuit may include an eleventh transistor M11, a twelfth transistor M12, a thirteenth transistor M13, and a fourth capacitor C4. A source of the eleventh transistor M11 may be coupled to the first power supply Vpos, a gate thereof may be coupled to a clock bar terminal CLKB, and a drain thereof may be coupled to a seventh node N7. A source of the twelfth transistor M12 may be coupled to the seventh node N7, a gate thereof may be coupled to an eighth node N8, and a drain thereof may be coupled to a clock terminal CLK. A source of the thirteenth transistor M13 may be coupled to the eighth node N8, a gate thereof may be coupled to the clock bar terminal CLKB, and a drain thereof may be coupled to the output terminal of the first stage 301. The fourth capacitor C4 may be coupled between the seventh node N7 and the eighth node N8.

The fifth circuit may include a fourteenth transistor M14, a fifteenth transistor M15, a sixteenth transistor M16, a seventeenth transistor M17, and a fifth capacitor C5. A source of the fourteenth transistor M14 may be coupled to the first power supply Vpos, a gate thereof may be coupled to the seventh node N7, and a drain thereof may be coupled to a ninth node N9. A source of the fifteenth transistor M15 may be coupled to the ninth node N9, a gate thereof may be coupled to the seventh node N7, a drain thereof may be coupled to a tenth node N10. A source of the sixteenth transistor M16 may be coupled to the ninth node N9, a gate thereof may be coupled to the tenth node N10, and a drain thereof may be coupled to the second power supply Vneg having a voltage less than that of the first power supply Vpos. A source of the seventeenth transistor M17 may be coupled to the tenth node N10, a gate thereof may be coupled to the clock bar terminal CLKB, and a drain thereof may be coupled to the first power supply Vneg. The fifth capacitor C5 may be coupled between the ninth node N9 and the tenth node N11.

The sixth circuit may include an eighteenth transistor M18, a nineteenth transistor M19, a twentieth transistor M20, a twenty-first transistor M21, and a sixth capacitor C6. A source of the eighteenth transistor M18 may be coupled to the first power supply Vpos, a gate thereof may be coupled to the ninth node N9, and a drain thereof may be coupled to an eleventh node N11. A source of the nineteenth transistor M19 may be coupled to the eleventh node N11, a gate thereof may be coupled to the ninth node N9, a drain thereof may be coupled to a twelfth node N12. A source of the twentieth transistor M20 may be coupled to the eleventh node N11, a gate thereof may be coupled to the twelfth node N12, and a drain thereof may be coupled the second power supply Vneg. A source of the twenty-first transistor M21 may be coupled to the twelfth node N12, a gate thereof may be coupled to the seventh node N7, and a drain thereof may be coupled to the second power supply Vneg. The sixth capacitor C6 may be coupled between the eleventh node N11 and the twelfth node N12. Further, the eleventh node N11 may be used as an output terminal. The first through twenty-first transistors M1-M21 may be PMOS transistors.

Figure 5:
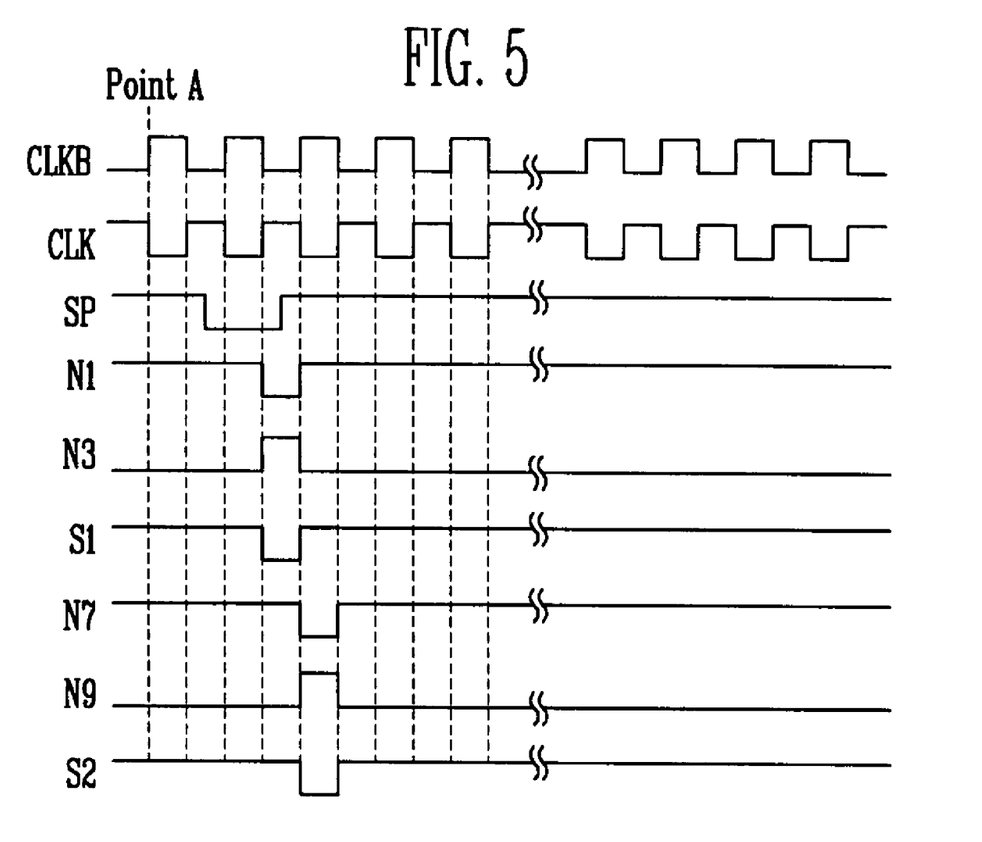
FIG. 5 illustrates a timing chart of the stages shown in FIG. 4.

FIG. 5 illustrates a timing chart of the stages shown in FIG. 4. The following is a description of an exemplary operation of the stages 301 and 302 shown in FIG. 4. Referring to FIG. 4, in the first stage 301, the first circuit may receive the clock signal CLK, the clock bar signal CLKB, and a start pulse SP, and may operate according to the received signals. The second circuit may receive the clock signal CLK and the output signal of the first circuit, i.e., a voltage of the first node N1, and may operate according to the received signals. The third circuit may operate according to the output signal of the first circuit, i.e., the voltage of the first node N1, and an output signal of the second circuit, i.e., the voltage of the third node N3.

In the second stage 302, the fourth circuit may receive the clock signal CLK, the clock bar signal CLKB, and a first scan signal S1, i.e., an output signal of the third circuit at the node N5, and may operate according to the received signals. The fifth circuit may receive the clock bar signal CLKB and an output signal of the fourth circuit, i.e., a voltage of the seventh node N7, and may operate according to the received signals. The sixth circuit may receive an output signal of the fourth circuit, namely, the voltage of the seventh node N7, and an output signal of the fifth circuit, i.e., a voltage of the ninth node N9.

An exemplary operation of the first and second stages 301 and 302 will now be described with reference to FIG. 4 and FIG. 5, which illustrates a timing chart of the stages shown in FIG. 4. Referring to FIG. 5, the operation will be described starting at a point A, at which point the clock signal CLK has a low level, the clock bar signal CLKB has a high level, and the start pulse signal SP has a high level.

In operation of the first circuit 301, at point A, when the clock signal CLK has a low level, the start pulse SP has a high level, and the clock bar signal CLKB has a high level, then the first transistor M1 and the third transistor M3 may be turned-on, a voltage of the first power supply Vpos may be provided to the first node N1, and the start pulse SP may be transferred to the second node N2. Thus, both the first node N1 and the second node N2 may be at a high level. The voltage of the first node N1 and the voltage of the second node N2 may be maintained by the first capacitor C1, and the voltage of the second node N2 may be at a high level to maintain the second transistor M2 in a turned-off state. The voltage of the first node N1 may be a voltage of the first power supply Vpos.

In the next half-cycle of the clock signals, when the clock signal CLK has a high level, the start pulse SP has a high level, and the clock bar signal CLKB has a low level, then the first transistor M1 and the third transistor M3 may be turned-off, thereby causing both terminals of the first capacitor C1 to be in a floating state. Accordingly, the first node N1 may maintain a voltage of the first power supply Vpos by the first capacitor C1. A gate voltage of the second transistor M2 may be at a high level due to the first capacitor C1, and thus the second transistor M2 may be in a turned-off state.

In the next half-cycle of the clock signals, when the clock signal CLK has a high level, the start pulse SP has a high level, and the clock bar signal CLKB has a low level, then the first transistor M1 and the third transistor M3 may be turned-off, thereby causing both terminals of the first capacitor C1 to be in a floating state. Accordingly, the first node N1 may maintain a voltage of the first power supply Vpos by the first capacitor C1. A gate voltage of the second transistor M2 may be at a high level due to the first capacitor C1, and thus the second transistor M2 may be in a turned-off state.

In the next half-cycle of the clock signals, when the clock signal CLK is at a low level, the start pulse SP is at a low level, and the clock bar signal CLKB is at a high level, then the first transistor M1 and the third transistor M3 may again be turned-on. Accordingly, a voltage of the first power supply Vpos may again be provided to the first node N1 and the start pulse may again be transferred to the second node N2. Since the start pulse SP is at a low level, the second node N2 may be driven to a low level by the start pulse SP, placing the second transistor M2 in a turned-on state. The drain of the second transistor M2 may be at a high level due to the clock bar signal CLKB, and so, with the clock bar signal CLKB (high) and Vpos across the second transistor M2, no electric current may flow across the second transistor M2. Accordingly, a voltage of the first node N1 may maintain the voltage of the first power supply Vpos.

In the next half-cycle of the clock signals, when the clock signal CLK is at a high level, the start pulse SP is at a high level, and the clock bar signal CLKB is at a low level, the first transistor M1 and the third transistor M3 may again be turned-off, thereby causing both terminals of the first capacitor C1 to again be in a floating state. At this time, the second node N2 may maintain a low level. Accordingly, a gate voltage of the second transistor M2 may be at a low level, keeping the second transistor M2 in a turned-on state, and a current path may exist from the source of the second transistor M2 to the drain thereof, thereby reducing the voltage of the first node N1. At this time, a voltage of the first node N1 may maintain a low level from the first capacitor C1, and the voltage of the first node N1 may be reduced by a voltage of the second power supply Vneg, which may cause a signal characteristic of the scan signal to be improved.

When the first node N1 has a high level voltage and the third node N3 has a low level voltage, the third circuit may cause a voltage of the fifth node N5, i.e., a voltage of the output terminal, to be at a high level. When the first node N1 has a low level voltage and the third node N3 has a high level voltage, the third circuit may cause a voltage of the fifth node N5, i.e., the voltage of the an output terminal, to be at a low level.

In operation of the second circuit, when the clock signal CLK has a low level and the first node N1 has a high level, then the seventh transistor M7 may be turned-on and the fourth transistor M4 and the fifth transistor M5 may be turned-off. At this time, a voltage of the fourth node N4 may be that of the second power supply Vneg, according to operation of the seventh transistor M7, so that the sixth M6 may be turned-on. Accordingly, a voltage of the third node N3 may be a low level, since the current flows from the third node N3 to the second power supply Vneg. At this time, a gate of the sixth transistor M6 may maintain a low level by the second capacitor C2. The voltage of the third node N3 may be a voltage of the second power supply Vneg, since the current flows from the third node N3 to the second power supply Vneg.

Further, when the clock signal CLK has a high level and a voltage of the first node N1 has a low level, then the fourth transistor M4 and the fifth transistor M5 may be turned-on by the voltage of the first node N1, although the seventh transistor M7 is turned-off by the clock signal CLK. Accordingly, a voltage of the first power supply Vpos may be transferred to the third node N3 and the voltages of the third node N3 and the fourth node N4 may be the same. Therefore, the sixth transistor M6 may be turned-off, so that the third node N3 maintains the voltage of the first node N1 and a high level signal is outputted.

In operation of the third circuit, when the voltage of the first node N1 has a high level, the voltage of the third node N3 may have a low level. The eighth transistor M8 and the ninth transistor M9 may be turned-on and the eleventh transistor M11 may have a high level, so that the voltages of the fifth node N5 and the sixth node N6 may be the same, and the tenth transistor M10 may be turned-off. Accordingly, the voltage of the fifth node N5 may have a high level, since may maintain the voltage of the first node N1. When the voltage of the first node N1 has a low level, the voltage of the third node N3 may have a high level. And, the eleventh transistor M11 may be turned-on and the eighth transistor M8 and the ninth transistor M9 may be turned-off, so that the current flows from the fifth node N5 to the second power supply Vneg. At this time, the voltage of the fifth node N5 may be the voltage of the second power supply Vneg, since the gate voltage of the tenth transistor M10 is maintained.

The second stage 302 may have substantially the same functions as those of the first stage 301. The second stage 302 may receive a voltage of the output terminal of the first stage 301, i.e., the first scan signal S1, and may operate according to the scan signal S1 instead of the start pulse SP.

Figure 6:
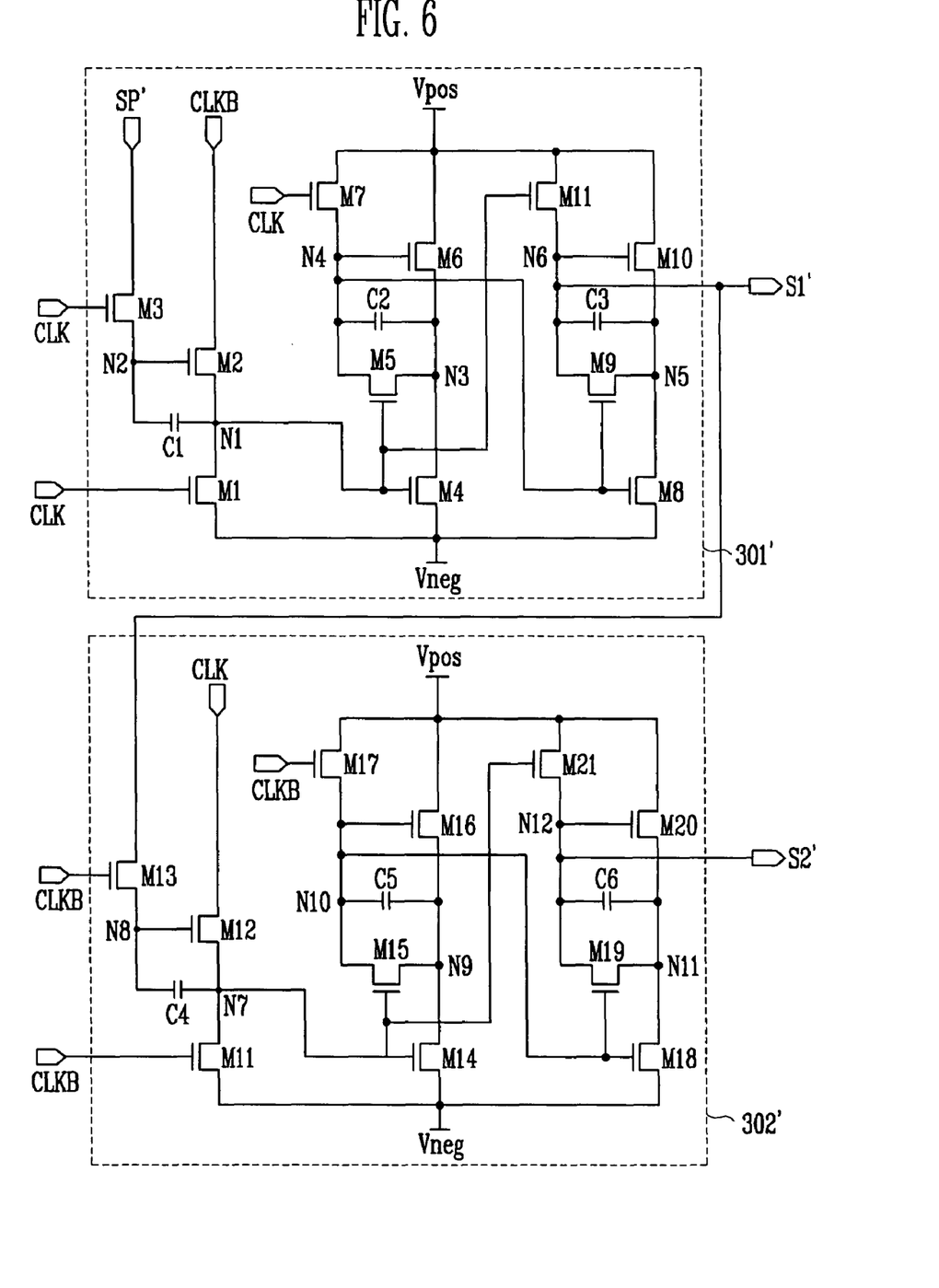
FIG. 6 illustrates a circuit diagram of two stages of a scan driver according to another embodiment of the present invention.
Figure 7:
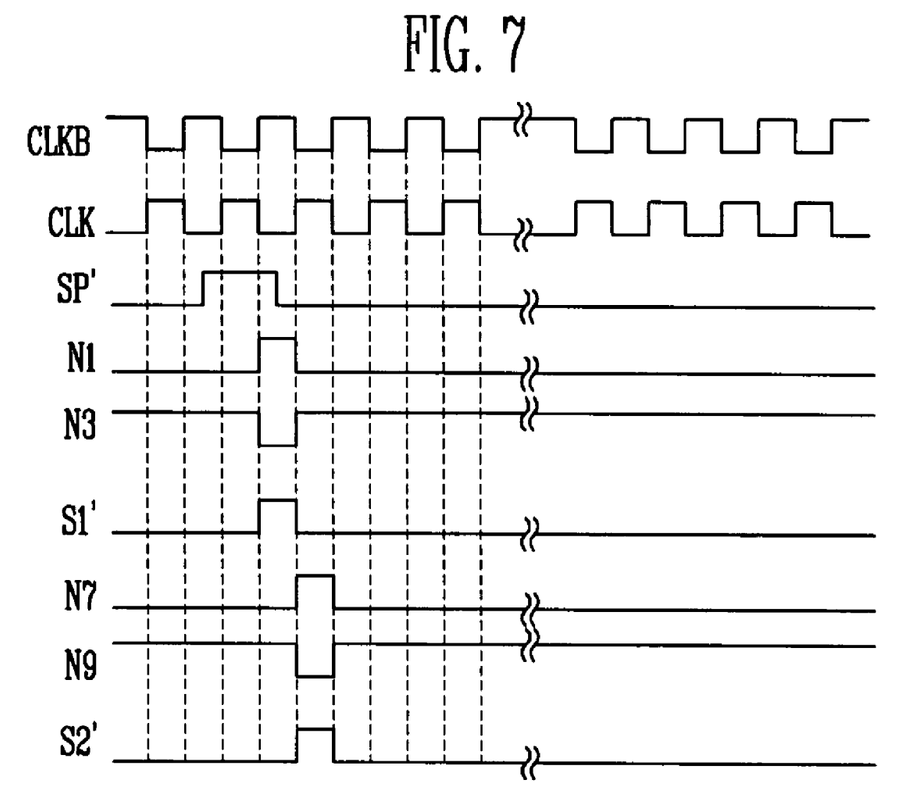
FIG. 7 illustrates a timing chart of the stages shown in FIG. 6.

FIG. 6 illustrates a circuit diagram of two stages of a scan driver according to another embodiment of the present invention, and FIG. 7 illustrates a timing chart of the stages shown in FIG. 6. A stage 301' according to this embodiment of the present invention may include a first circuit, a second circuit and a third circuit, and a subsequent stage 302' may include a fourth circuit, a fifth circuit, and a sixth circuit. In this embodiment, the circuits may be formed using NMOS transistors. The first stage 301' may receive a start pulse SP' that is at a low level and then transitions to a high level, and the first stage 301' may output a first scan signal S1' that has a high-level pulse. The second stage 302' may receive the first scan signal S1' and may output a second scan signal S2'.

In the scan driver, a scan signal driving method, and an organic light emitting display using the same according to the present invention, the scan driver may be formed using all PMOS transistors or all NMOS transistors. Accordingly, when a pixel formed on a substrate is manufactured using only PMOS transistors or only NMOS transistors, the scan driver may similarly be formed using the PMOS transistors or the NMOS transistors, respectively. Thus, the scan driver may be formed using a same process as the pixel portion. This may allow the process to be simplified, the size and weight of the organic light emitting display to be reduced, and manufacturing costs to be reduced. In addition, as the scan signal may have a voltage of a second power supply, a signal characteristic thereof may be enhanced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. A scan driver, comprising:
a plurality of stages coupled to each other in series, each of the stages configured to receive a clock signal, a clock bar signal, and an input signal, wherein each stage includes a first circuit that is configured to:
store a first voltage and a second voltage in response to the input signal and one of the clock signal or the clock bar signal, the first voltage and the second voltage each corresponding to a voltage of the input signal, and provide a first output signal that corresponds to the second voltage in response to the second voltage and the other of the clock signal or the clock bar signal, the first circuit in a first stage including:
a first capacitor having a first electrode coupled to a first node and having a second electrode coupled to a second node;
a first transistor configured to transfer a drive power of a power supply to the first node, the first transistor receiving the clock signal or the clock bar signal at a gate thereof; and
a third transistor configured to transfer the voltage of the input signal to the second node, the third transistor receiving the clock signal or the clock bar signal a gate thereof, wherein:
the first circuit in the first stage further includes a second transistor,
the first transistor is configured to transfer the drive power to the first node in response to the clock signal,
the second transistor is configured to control a voltage of the first node in response to a voltage of the second node,
the third transistor is configured to transfer the voltage of the input signal to the second node in response to the clock signal,
the first capacitor is configured to store a voltage corresponding to the drive power and the input signal voltage, and
a voltage of the first output signal corresponds to the voltage of the first node.

2. The scan driver as claimed in claim 1, wherein:
the input signal is a start pulse when the stage is the first stage, and
the input signal is an output signal of a previous stage when the stage is not the first stage.

3. The scan driver as claimed in claim 1, wherein the first circuit in a second stage directly succeeding the first stage includes:
an eleventh transistor configured to transfer a drive power to a seventh node in response to the clock bar signal;
a twelfth transistor configured to control a voltage of the seventh node in response to a voltage of an eighth node;
a thirteenth transistor configured to transfer a voltage of a signal output by the first stage to the eighth node in response to the clock bar signal; and
a fourth capacitor coupled to the seventh node and the eighth node and configured to store a voltage corresponding to the drive power and the voltage of the signal output by the first stage,
wherein the first circuit in the second stage is configured to output a signal having a voltage corresponding to the voltage of the seventh node.

4. The scan driver as claimed in claim 1, wherein each stage further includes:
a second circuit configured to receive the first output signal from the first circuit and the one of the clock signal or the clock bar signal, and configured to provide a second output signal; and
a third circuit configured to receive the first output signal and the second output signal, and configured to provide a scan signal.

5. The scan driver as claimed in claim 4, wherein:
the input signal includes a first pulse having a pulse width equal to one-half cycle of the clock signal,
the scan signal includes a second pulse having a pulse width equal to that of the first pulse,
the polarity of the first pulse is the same as the polarity of the second pulse, and
the second pulse is offset from the first pulse by one half clock cycle.

6. The scan driver as claimed in claim 4, wherein the second circuit includes:
a fourth transistor configured to transfer the drive power to a third node in response to the first output signal;
a fifth transistor configured to control the third and fourth nodes to have a same voltage in response to the first output signal;
a sixth transistor configured to control a voltage of the third node in response to a voltage of the fourth node;
a seventh transistor configured to control a voltage of the fourth node in response to the clock signal; and
a second capacitor coupled to the third node and the fourth node,
wherein a voltage of the second output signal corresponds to the voltage of the third node.

7. The scan driver as claimed in claim 4, wherein the third circuit includes:
an eighth transistor configured to transfer the drive power to a fifth node in response to the second output signal;
a ninth transistor configured to control the fifth node and a sixth node to have a same voltage in response to the second output signal;
a tenth transistor configured to control the voltage of the fifth node in response to a voltage of the sixth node;
an eleventh transistor configured to control the voltage of the sixth node in response to the first output signal; and
a third capacitor coupled to the fifth node and the sixth node,
wherein a voltage of the scan signal corresponds to the voltage of the fifth node.

8. The scan driver as claimed in claim 4, wherein the first, second and third circuits are formed using one of PMOS transistors and NMOS transistors.

9. An organic light emitting display, comprising:
a pixel portion having at least one pixel coupled to a data line and a scan line;
a data driver configured to provide a data signal to the data line; and
a scan driver configured to provide a scan signal to the scan line,
wherein the scan driver includes:
a plurality of stages coupled to each other in series, each of the stages configured to receive a clock signal, a clock bar signal, and an input signal, wherein each stage includes a first circuit that is configured to:
store a first voltage and a second voltage in response to the input signal and one of the clock signal or the clock bar signal, the first voltage and the second voltage each corresponding to a voltage of the input signal, and
provide a first output signal that corresponds to the second voltage in response to the second voltage and the other of the clock signal or the clock bar signal, the first circuit in a first stage including:
a first capacitor having a first electrode coupled to a first node and having a second electrode coupled to a second node;
a first transistor configured to transfer a drive power of a power supply to the first node, the first transistor receiving the clock signal or the clock bar signal at a gate thereof; and
a third transistor configured to transfer the voltage of the input signal to the second node, the third transistor receiving the clock signal or the clock bar signal a gate thereof, wherein:

the first circuit in the first stage further includes a second transistor, the first transistor is configured to transfer the drive power to the first node in response to the clock signal, the second transistor is configured to control a voltage of the first node in response to a voltage of the second node, the third transistor is configured to transfer the voltage of the input signal to the second node in response to the clock signal, the first capacitor is configured to store a voltage corresponding to the drive power and the input signal voltage, and a voltage of the first output signal corresponds to the voltage of the first node.

10. The organic light emitting display as claimed in claim 9, wherein:

the input signal is a start pulse when the stage is the first stage, and the input signal is an output signal of a previous stage when the stage is not the first stage.

11. The organic light emitting display as claimed in claim 9, wherein each stage further includes:

a second circuit configured to receive the first output signal from the first circuit and the one of the clock signal or the clock bar signal, and configured to provide a second output signal; and a third circuit configured to receive the output signal and the second output signal, and configured to provide a scan signal.

12. The organic light emitting display as claimed in claim 11, wherein:

the input signal includes a first pulse having a pulse width equal to one-half cycle of the clock signal, the scan signal includes a second pulse having a pulse width equal to that of the first pulse, the polarity of the first pulse is the same as the polarity of the second pulse, and the second pulse is offset from the first pulse by one half clock cycle.

13. The organic light emitting display as claimed in claim 11, wherein the second circuit includes:

a fourth transistor configured to transfer the drive power to a third node in response to the first output signal;

a fifth transistor configured to control the third and fourth nodes to have a same voltage in response to the first output signal;

a sixth transistor configured to control a voltage of the third node in response to a voltage of the fourth node;

a seventh transistor configured to control a voltage of the fourth node in response to the clock signal; and a second capacitor coupled to the third node and the fourth node, wherein a voltage of the second output signal corresponds to the voltage of the third node.

14. The organic light emitting display as claimed in claim 11, wherein the third circuit includes:

an eighth transistor configured to transfer the drive power to a fifth node in response to the second output signal;

a ninth transistor configured to control the fifth node and a sixth node to have a same voltage in response to the second output signal;

a tenth transistor configured to control the voltage of the fifth node in response to a voltage of the sixth node;

an eleventh transistor configured to control the voltage of the sixth node in response to the first output signal; and a third capacitor coupled to the fifth node and the sixth node, wherein a voltage of the scan signal corresponds to the voltage of the fifth node.

15. The organic light emitting display as claimed in claim 11, wherein the first, second and third circuits are formed using one of PMOS transistors and NMOS transistors.

* * * * *